United States Patent [19]

Franz

[11] Patent Number: 4,785,344

[45] Date of Patent: * Nov. 15, 1988

[54] SEMI-CONDUCTOR COMPONENT WITH CONTACT HOLE

[75] Inventor: Guenther Franz, Munich, Fed. Rep. of Germany

[73] Assignee: Siemens Aktiengesellschaft, Berlin and Munich, Fed. Rep. of Germany

[ * ] Notice: The portion of the term of this patent subsequent to Feb. 26, 2002 has been disclaimed.

[21] Appl. No.: 692,757

[22] Filed: Jan. 18, 1985

[30] Foreign Application Priority Data

Jan. 27, 1984 [DE] Fed. Rep. of Germany ....... 3402867

[51] Int. Cl.$^4$ ............................................ H01L 23/48
[52] U.S. Cl. ..................... 357/65; 357/23.4; 357/86; 357/91
[58] Field of Search .................... 357/86, 23.4, 68, 65, 357/55, 91

[56] References Cited

U.S. PATENT DOCUMENTS

| | | | |
|---|---|---|---|
| 4,035,826 | 7/1977 | Morton et al. | 357/42 |
| 4,443,931 | 4/1984 | Baliga | 357/86 |
| 4,502,069 | 2/1985 | Schuh | 357/23.4 |
| 4,516,143 | 5/1985 | Love | 357/86 |

FOREIGN PATENT DOCUMENTS 3015782 11/1980 Fed. Rep. of Germany .

Primary Examiner—Andrew J. James
Assistant Examiner—Mark Prenty
Attorney, Agent, or Firm—Adel A. Ahmed; Karl F. Milde, Jr.

[57] ABSTRACT

In power MOSFETs the source zone (5) and the channel zone (4) must be contacted by a common contact (15). If the contact material is aluminum and if the channel zone (4) is n-conductive (p-channel MOSFET), a surface region (8) of the channel zone (4) is additionally n-doped through an opening (6) in the source zone (5) thereabove with a dose of $\geq 5 \times 10^{14}$ atoms cm$^{-2}$. The aluminum contact (15) contacts the channel zone (4) at this region (8) thereby forming a purely ohmic contact to the channel zone.

3 Claims, 1 Drawing Sheet

SEMI-CONDUCTOR COMPONENT WITH CONTACT HOLE

BACKGROUND OF THE INVENTION

The invention relates to a semiconductor component with the folowing features:

(a) A first zone of a first conductivity type is arranged on one of the surfaces of a semiconductor body;

(b) A second zone of a second conductivity type is embedded in the first zone;

(c) The second zone is provided with an opening;

(d) The first zone has an exposed area under this opening not covered by the second zone; and (e) The first and second zones are interconnected electrically by a contact.

A semiconductor component of this type has been described, for example, in the German Paten Publication (DOS) No. 3,015,782, in particular with reference to FIG. 9. This semiconductor component has a source contact in the opening which contacts the source zone lying on the surface of the semiconductor body, and an epitaxial layer underlying the source zone in a depression. The source contact is generally made of aluminum. On p-doped silicon aluminum forms a good ohmic contact independently of the doping of the p-doped zone. An ohmic contact to n-doped silicon, however, presupposes that this zone is very highly doped; e.g., over $10^{19}$ atoms $cm^{-3}$. If a p-doped zone is embedded into the n-doped zone—as is necessary, for example, for a p-channel MOSFET—the p-doped zone must be doped still higher if a dope reversal relative to the n-doped zone is to be obtained at all.

SUMMARY OF THE INVENTION

It is the object of the present invention to develop a semiconductor component of the type described above which permits an ohmic contact of the n-doped zone with an aluminum layer without need for a higher doping of the embedded p-conductive zone than the electrical properties of the semiconductor component require.

This object, as well as other objects which will become apparent from the discussion that follows are achieved, according to the present invention, by providing a semiconductor component of the type described above but with the following additional characteristics:

(a) The first zone of the semiconductor component is n-conductive;

(b) The second zone is p-conductive;

(c) The contact consists of aluminum;

(d) An n-conductive layer with an implantation dose of at least $5 \times 10^{14}$ atoms $cm^{-2}$ is embedded in the exposed area of the first zone; and (e) The contact contacts the first zone at the above-mentioned layer.

For a full understanding of the present invention, reference should now be made to the following detailed description of preferred embodiment of the invention and to the accompanying drawing.

DESCRIPTION OF THE PREFERRED EMBODIMENT

Figure 1:
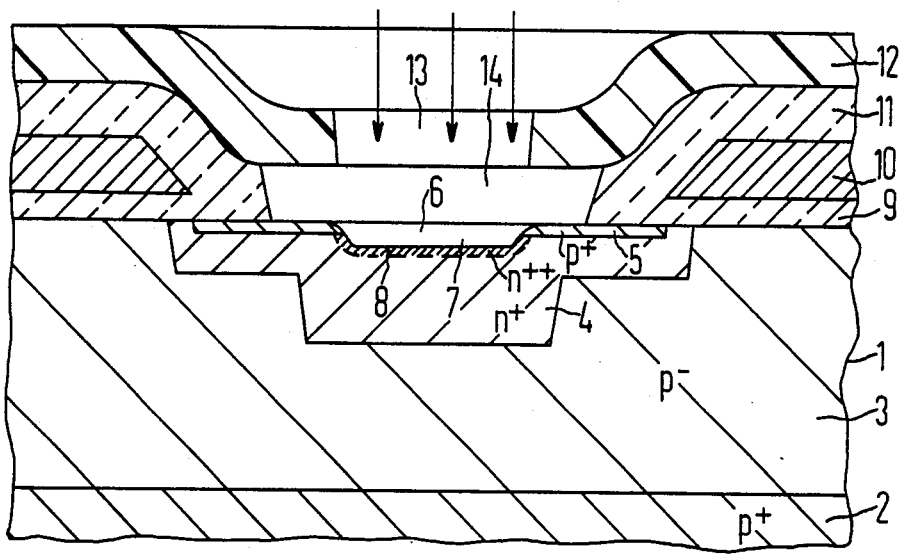
FIG. 1 shows a section through a semiconductor component according to the present invention at an intermediate stage of fabrication.

The semiconductor component according to the invention and shown in FIG. 1 has a semiconductor body 1. This semiconductor body 1 consists of highly p-doped substrate 2, on which is arranged a low p-doped layer 3, such as an epitaxial layer. In the surface of the semiconductor body 1—i.e. on the layer 3—is embedded a first zone 4 which is highly n-conductive. As shown, the zone 4 may have a greater thickness in the center than externally. In this case the central portion is diffused-in in a known manner and the outer, thinner portion is produced, for example, by ion implantation and subsequent driving in. The zone 4 may alternatively have a constant thickness and is then formed by ion implantation and subsequent driving in alone. Onto the surface of the layer 3 and of the first zone 4 is applied a first oxide layer 9 which consists of silicon dioxide if the semiconductor body is silicon. Onto the first oxide layer 9 is applied a layer 10 of polycrystalline silicon in certain predetermined regions. This can be done by whole-area application and structured etching. The polycrystalline silicon layer 10 serves, in a known manner, as a mask for the implantation of a second zone 5 and as a gate electrode for the p-channel MOSFET. The second zone 5 is produced, for example, by implantation of boron ions. The implantation dose may, for example, be $2 \times 10^{15}$ atoms $cm^{-2}$ and its thickness may be 0.5 microns. The orientation of the second zone 5 to the first zone 4 is such as to produce p-channels of the desired length on the surface of layer 3.

The next step is to apply a second oxide layer 11 on the first oxide layer 9 and the polycrystalline silicon layer 10. This layer 11 is then coated with a photoresist layer 12. An opening is thereafter produced in photoresist layer 12. Through the opening, the surface is isotropically wet-etched in the region of the zone 5 or, respectively, on the surface of the semiconductor body until there is achieved an etching of the photoresist mask from below. The oxide layers 9, 11 are thereby opened; this opening is marked 14. Appropriately, the etching is stopped when a portion of the surface of the second zone 5 is exposed.

Thereafter the photoresist mask 12 is used for etching an opening 6 into the second zone 5. An (anisotropic) plasma etching process, e.g. with sulfur hexafluoride $SF_6$, is used for this purpose. The plasma is directed onto the surface of zone 5 through the opening 13 of the photoresist mask 12 in the direction of the arrows. The plasma etching process can be selectively continued until a depression 7 has been etched into the first zone 4; however, this is not absolutely necessary. What is essential, however, is that the zone 4 be given an area exposed toward the top.

After baring the surface of the first zone 4, the exposed surface of the first zone 4 is doped by ion implantation—e.g., with phosphorus—thereby producing a highly n-conductive layer 8. This layer 8 is either flat or, in the case of the previous production of the depression 7, is formed by the wall and bottom of the depression. The doping is carried out with a dose of $\geq 5 \times 10^{14}$ atoms $cm^{-2}$ at an energy of, for example, 30 keV. At a thickness of 0.1 microns this corresponds to a maximum doping of about $1 \times 10^{20}$ atoms $cm^{-3}$.

Figure 2:
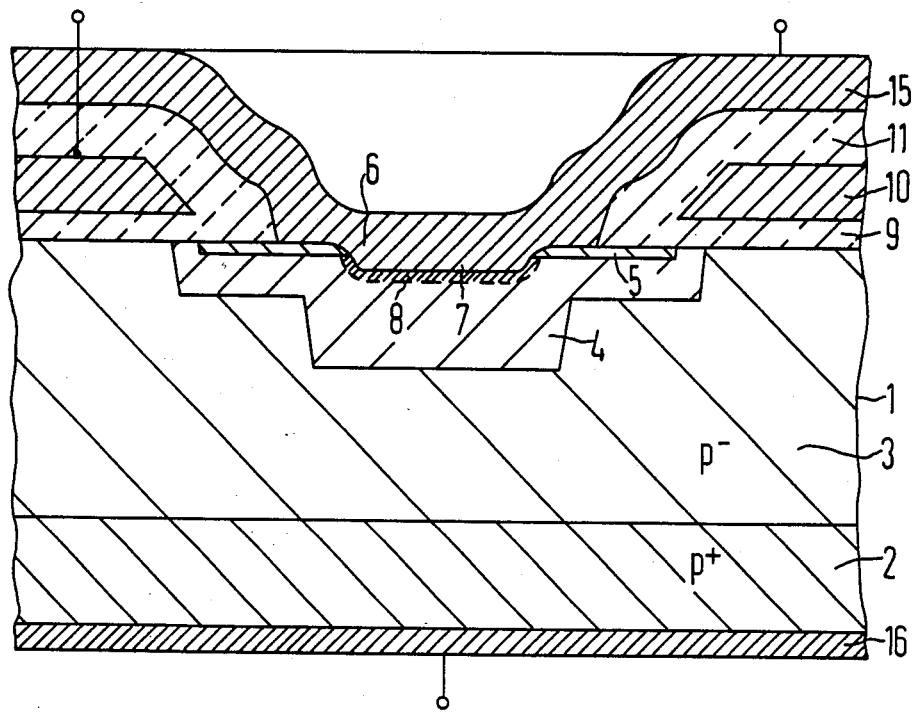
FIG. 2 shows a section through the completed, contacted semiconductor component.

After removal of the photoresist mask 12, the semiconductor component is covered with an aluminum layer 15, which contacts the zones 4 and 5. The other contact (drain contact) is applied, for example, on the underside of the semiconductor body 1 and is marked 16 in FIG. 2. To obtain optimum contact between the aluminum layer 15 and the first zone 4, it is advisable to eliminate the crystal defects produced by the implantation in the highly n-conductive zone 8.

The invention has been described in connection with a p-channel MOSFET. The purpose of the contacting of the first zone 4 and of the second zone 5 by a single contact is to establish a shunt between these zones. The properties of the inverse diode contained int he MOSFET and formed by the zones 3 and 4 are thereby improved. The invention is applicable also in bipolar semiconductor components, for example, when a p-doped zone and an n-doped zone lying below it are to be contacted by the same contact and when the p-doped top layer can no longer be formed defect-free if a doping sufficient for satisfactory ohmic contact exists in the n-doped zone therebelow.

There has thus been shown and described a novel semiconductor component, and method for making a semiconductor component, which fulfills all the objects and advantages sought therefor. Many changes, modifications, variations and other uses and applications of the subject invention will, however, become apparent to those skilled in the art after considering this specification and the accompanying drawing which discloses the preferred embodiment thereof. All such changes, modifications, variations and other uses and applications which do not depart from the spirit and scope of the invention are deemed to be covered by the invention which is limited only by the claims which follow.

What is claimed is:

1. A semiconductor component comprising:
   a P-conductive semiconductor body having a first surface;
   an N-conductive first zone embedded in said first surface of said semiconductor body and being of higher conductivity than said semiconductor body;
   a P-conductive second zone embedded in said first zone;
   an oxide layer on said first surface of said semiconductor body and having a first opening therein, said opening exposing a part of a surface of said second zone;
   said second zone having a second opening therein providing an exposed surface area of said first zone beneath said second opening;
   an N-conductive layer having an implantation dose of at least $5 \times 10^{14}$ CM$^{-2}$ embedded in said exposed surface area of said first zone, thereby providing a layer having a higher conductivity than said first zone; and
   an aluminum contact electrically connecting the exposed surface of said second zone and said N-conductive layer.

2. The semiconductor component defined in claim 1, wherein said n-conductive layer is approximately 0.1 microns thick.

3. The semiconductor component defined in claim 1, wherein said n-conductive layer is located on the surface of a depression provided in said first zone beneath said opening.

* * * * *